(12) United States Patent
Harley et al.

(10) Patent No.: US 9,466,616 B2
(45) Date of Patent: Oct. 11, 2016

(54) UNIFORM JUNCTION FORMATION IN FINFETS

(71) Applicant: GLOBALFOUNDRIES INC., Grand Cayman (KY)

(72) Inventors: Eric C. T. Harley, Lagrangeville, NY (US); Judson R. Holt, Wappingers Falls, NY (US); Yue Ke, Fishkill, NY (US); Timothy J. McArdle, Hopewell Junction, NY (US); Shogo Mochizuki, Clifton Park, NY (US); Alexander Reznicek, Troy, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/054,951

(22) Filed: Feb. 26, 2016

(65) Prior Publication Data

US 2016/0181285 A1 Jun. 23, 2016

Related U.S. Application Data

(62) Division of application No. 14/499,493, filed on Sep. 29, 2014, now Pat. No. 9,318,608.

(51) Int. Cl.
*H01L 27/12* (2006.01)
*H01L 29/78* (2006.01)
*H01L 29/08* (2006.01)
*H01L 29/06* (2006.01)

(52) U.S. Cl.
CPC ....... *H01L 27/1211* (2013.01); *H01L 29/0649* (2013.01); *H01L 29/0847* (2013.01); *H01L 29/785* (2013.01); *H01L 29/7848* (2013.01)

(58) Field of Classification Search
CPC ........... H01L 29/66795; H01L 29/785; H01L 29/66545; H01L 29/7848; H01L 29/7851; H01L 27/0886; H01L 21/823431
See application file for complete search history.

(56) References Cited

U.S. PATENT DOCUMENTS

| | | |
|---|---|---|
| 6,365,476 B1 | 4/2002 | Talwar et al. |
| 6,673,683 B1 | 1/2004 | Sheu et al. |
| 7,176,116 B2 | 2/2007 | Cabral, Jr. et al. |
| 7,473,964 B2 | 1/2009 | Izumida |
| 7,682,916 B2 | 3/2010 | Murthy et al. |
| 8,816,391 B2 * | 8/2014 | Ko .............................. 257/192 |
| 2003/0032231 A1 | 2/2003 | Efland et al. |
| 2012/0302019 A1 | 11/2012 | Cheng et al. |
| 2013/0153972 A1 | 6/2013 | Guillorn |

OTHER PUBLICATIONS

Office Action Communication, U.S. Appl. No. 14/499,493, Dated Oct. 28, 2015, pp. 1-8.
Notice of Allowance Communication, U.S. Appl. No. 14/499,493, Dated Jan. 14, 2016, pp. 1-10.

* cited by examiner

*Primary Examiner* — Tony Tran
(74) *Attorney, Agent, or Firm* — Yuanmin Cai, Esq.

(57) ABSTRACT

The present invention relates generally to semiconductor devices and more particularly, to a structure and method of forming an abrupt junction in the channel regions of high density technologies, such as tight pitch FinFET devices, using recessed source-drain (S-D) regions and annealing techniques. In an embodiment, a faceted buffer layer, deposited before the S-D region is formed, may be used to control the profile and dopant concentration of the junction under the channel. In another embodiment, the profile and dopant concentration of the junction may be controlled via a dopant concentration gradient in the S-D region.

5 Claims, 11 Drawing Sheets

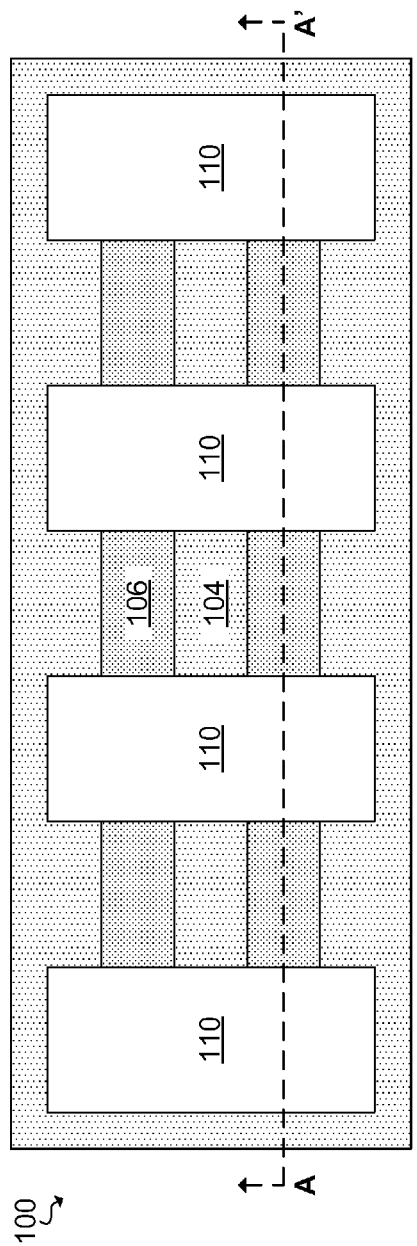
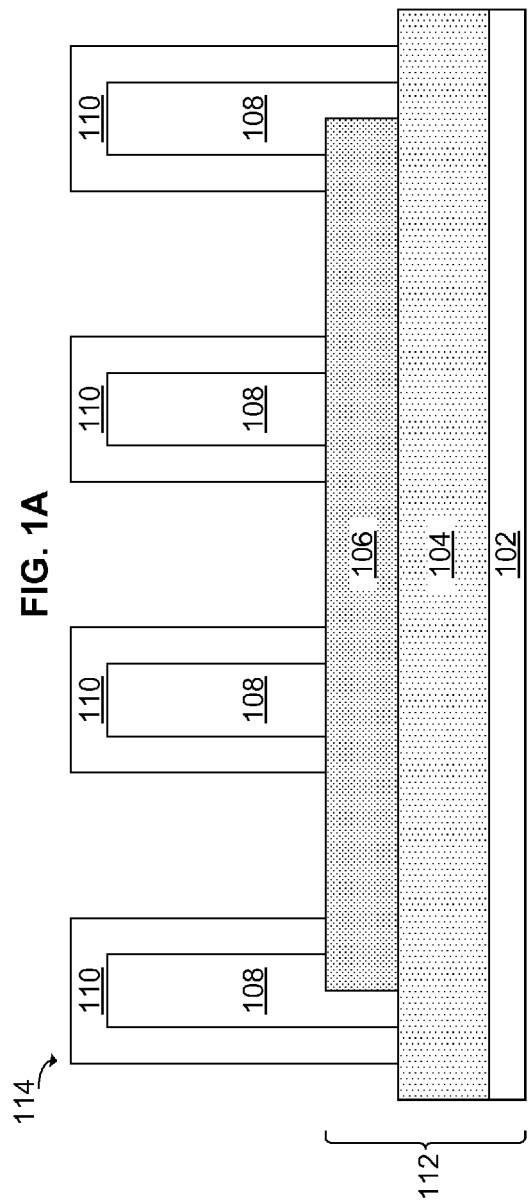
FIG. 1A
FIG. 1B

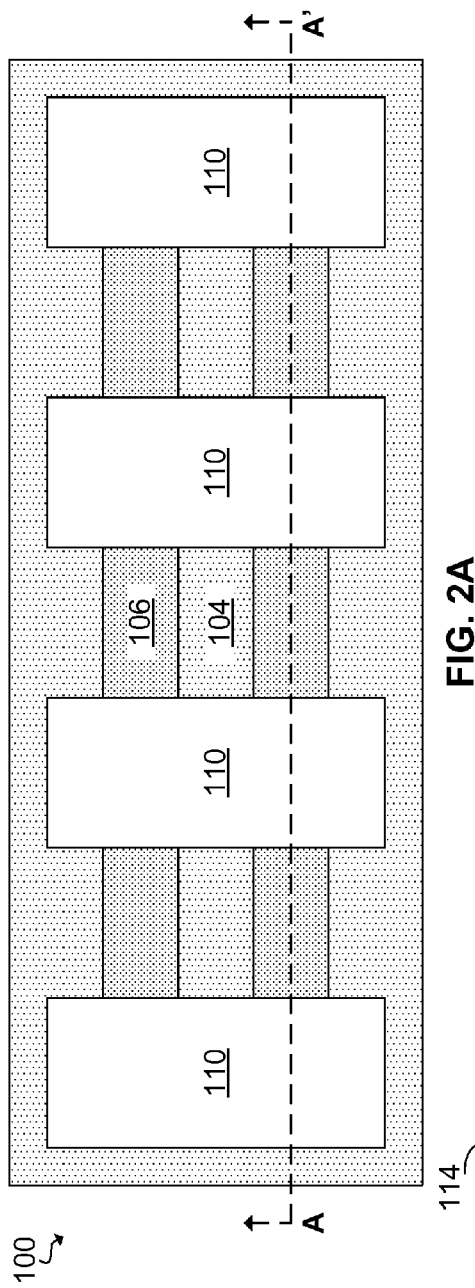
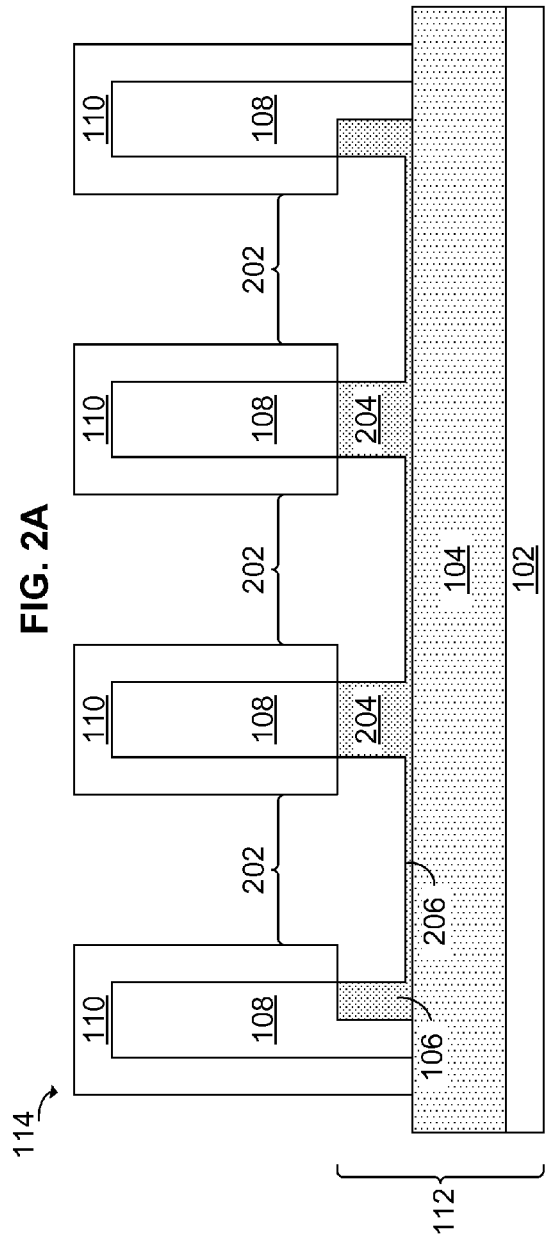
FIG. 2A
FIG. 2B

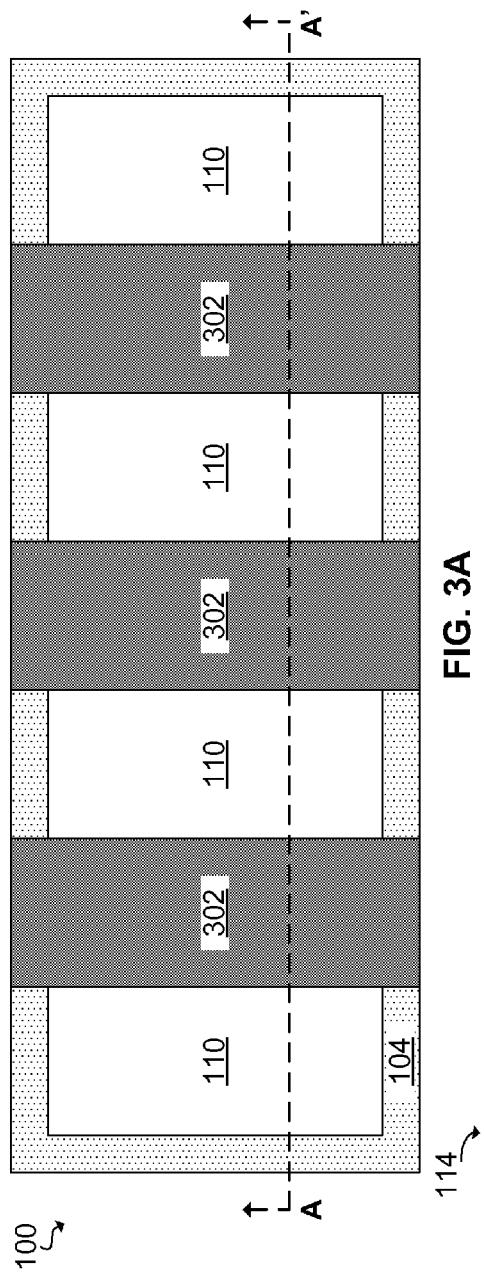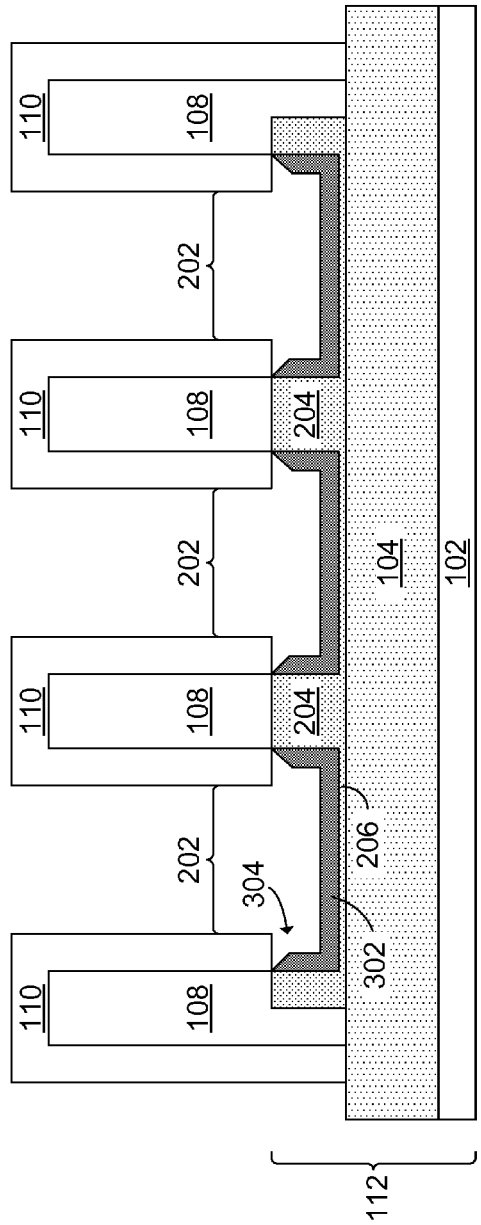
FIG. 3A
FIG. 3B

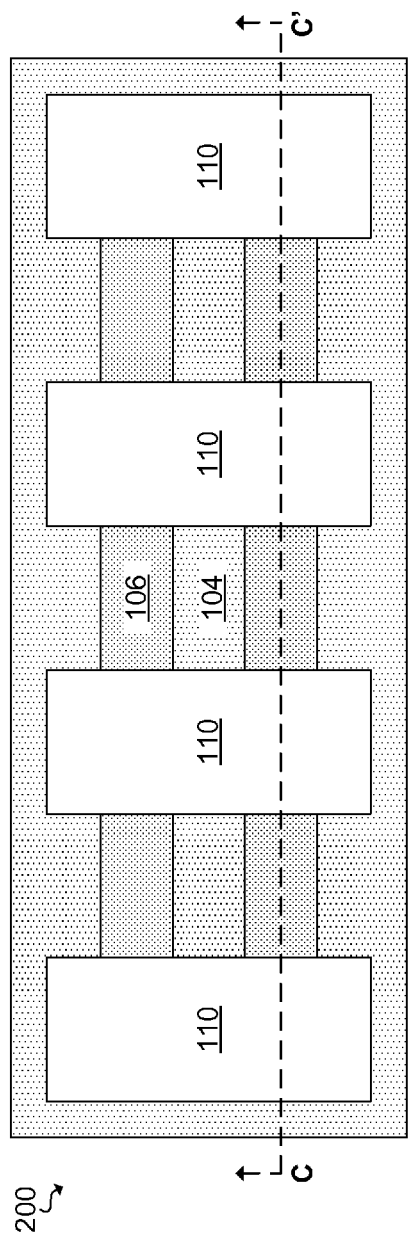
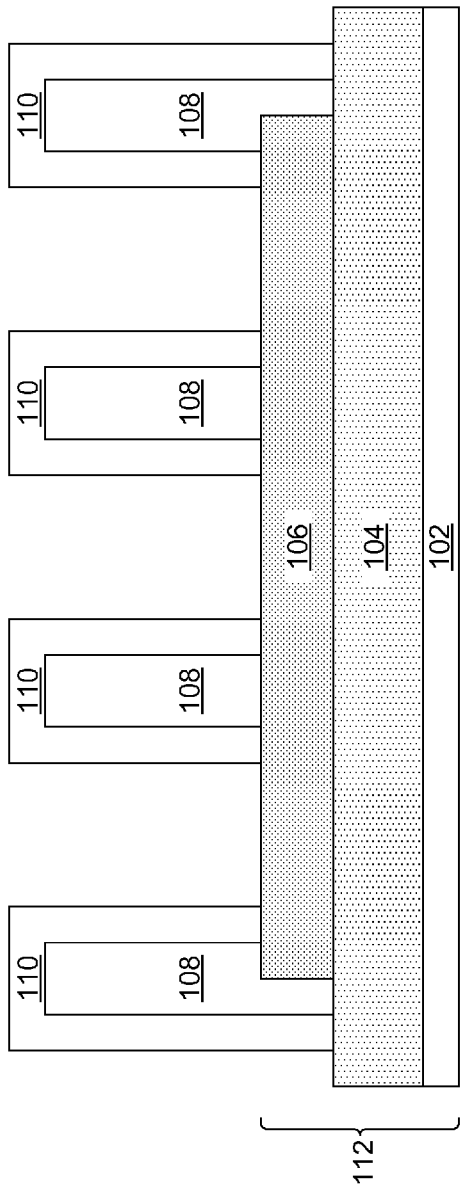

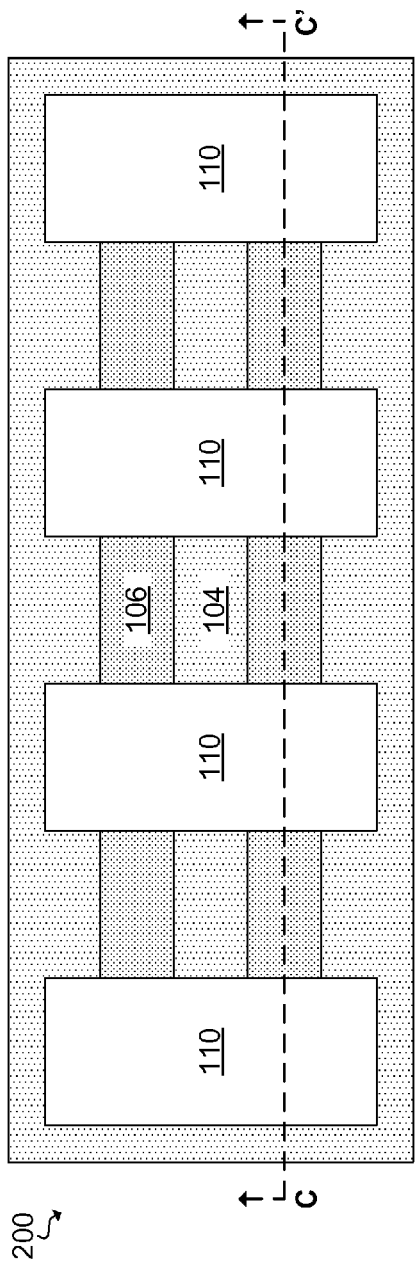
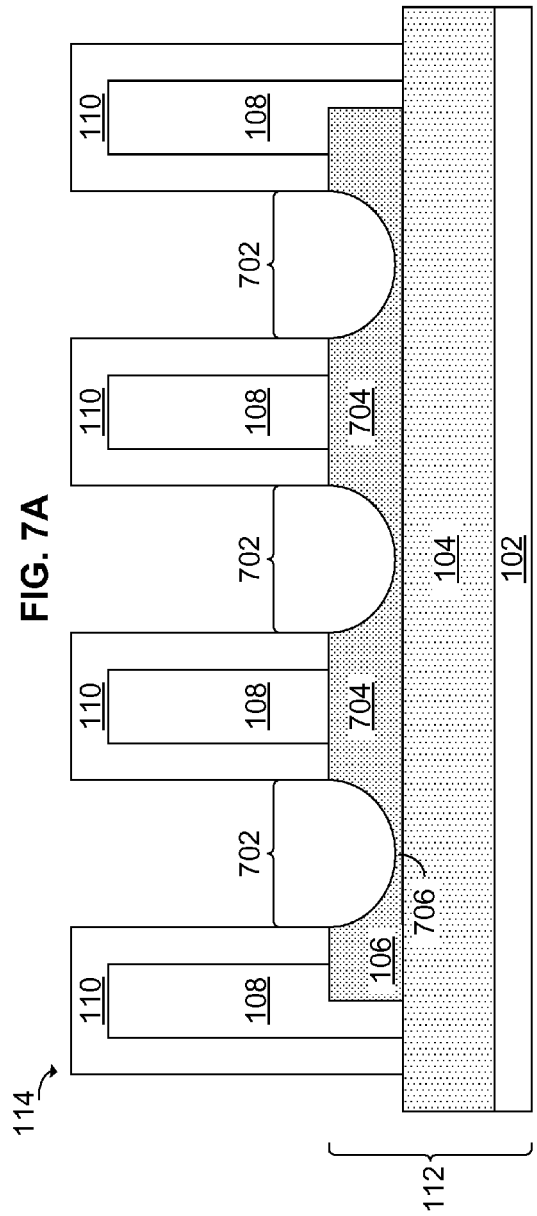
FIG. 7A
FIG. 7B

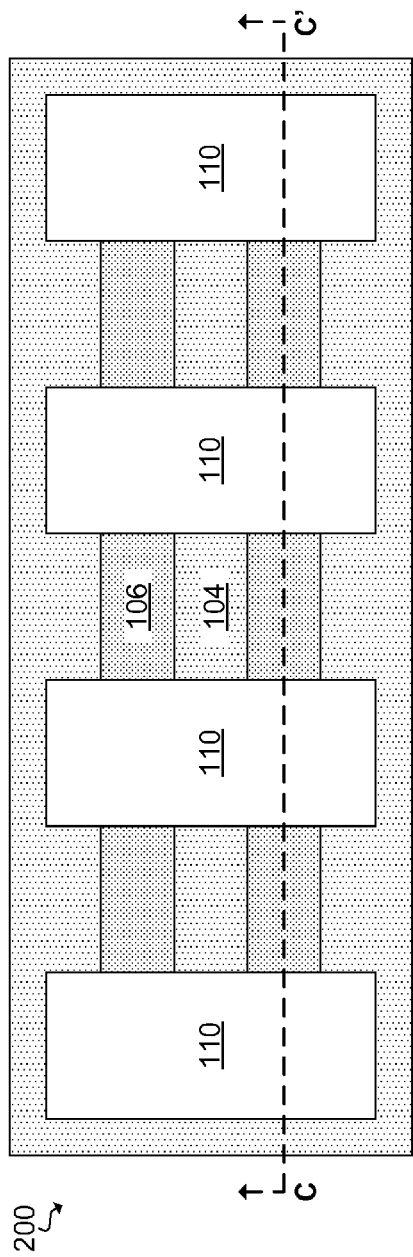
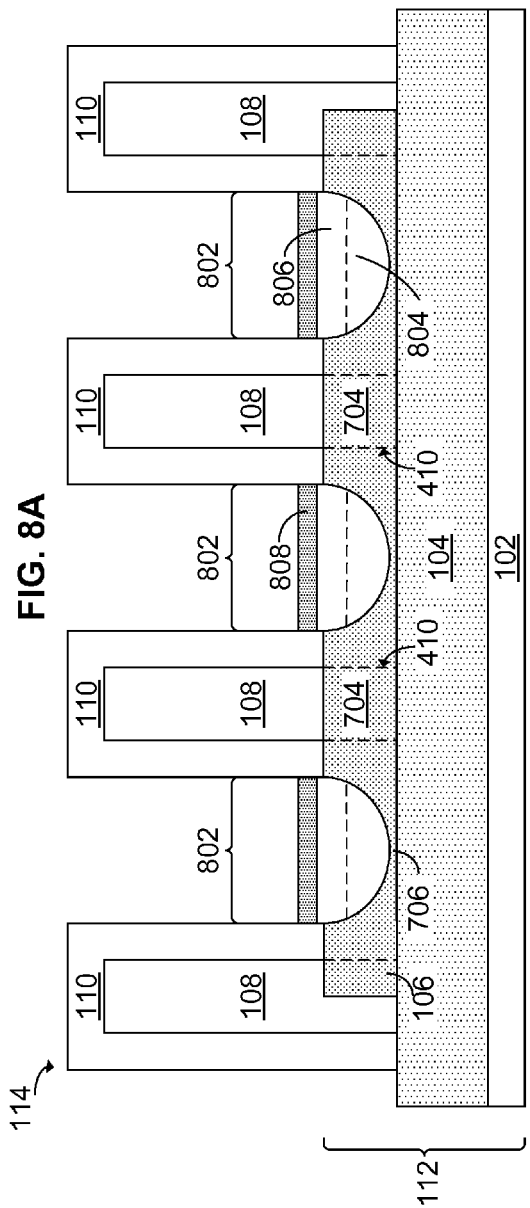
FIG. 8A
FIG. 8B

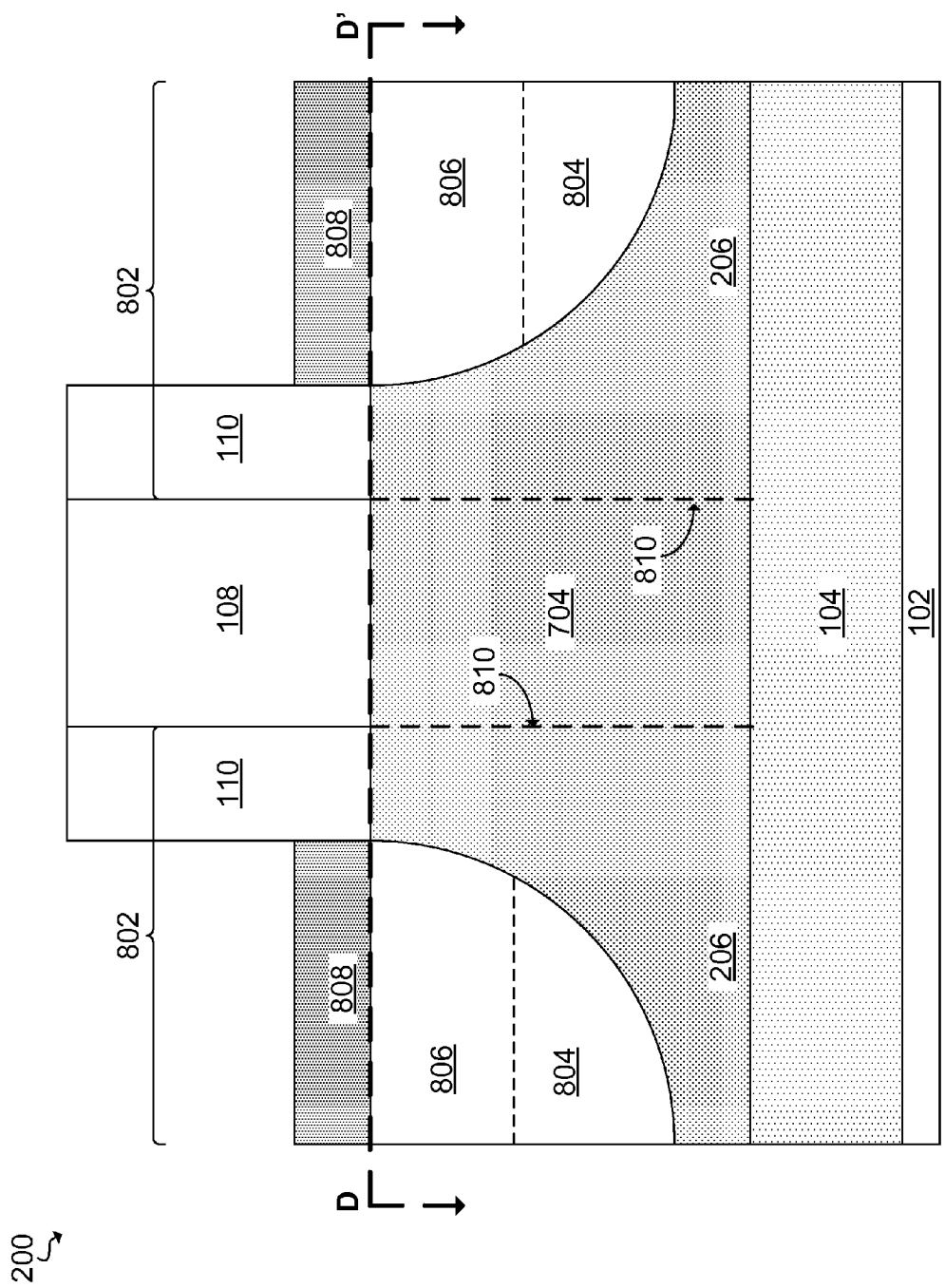

UNIFORM JUNCTION FORMATION IN FINFETS

CROSS-REFERENCE TO RELATED APPLICATIONS

The present application is a divisional of and claims the benefit of priority of U.S. patent application Ser. No. 14/499,493, filed on Sep. 29, 2014, the contents of which are herein incorporated by reference in its entirety.

BACKGROUND

The present invention relates generally to semiconductor devices and more particularly, to a structure and method of forming a uniform channel and abrupt junction in fin field effect transistors (FinFETs).

The gain of a field effect transistor (FET), usually defined by the transconductance ($g_m$), is proportional to the mobility ($\mu$) of the majority carrier in the transistor channel. The current carrying capability, and hence the performance of a FET, is proportional to the mobility of the majority carrier in the channel. The mobility of holes, which are the majority carriers in a P-channel field effect (PFET) transistor, and the mobility of electrons, which are the majority carriers in an N-channel field effect (NFET) transistor, may be enhanced by applying an appropriate stress to the channel using dopant junctions.

SUMMARY

According to an embodiment, a method is disclosed. The method may include: forming a fin on a semiconductor substrate; forming a first gate structure on the fin, the first gate structure including a first gate in contact with a side surface and a top surface of the fin and a first spacer surrounding the first gate; forming a second gate structure on the fin, the second gate structure including a second gate in contact with the side surface and the top surface of the fin and a second spacer surrounding the gate; removing part of the fin between the first gate and the second gate to form a fin recess, the fin recess having a first sidewall that is substantially flush with a sidewall of the first gate and second sidewall that is substantially flush with a sidewall of the second gate, wherein a portion of the fin remains below the fin recess; forming a buffer layer on the first sidewall, the second sidewall, and a bottom surface of the fin recess, the buffer layer having a first facet below the first spacer and a second fact below the second spacer; forming a doped epitaxial S-D region on the buffer layer in the fin recess; and annealing the doped epitaxial S-D region to diffuse dopant atoms into a region of the fin below the first gate and the second gate to form an abrupt junction.

According to another embodiment, a method is disclosed. The method may include: forming a fin on a semiconductor substrate; forming a first gate structure on the fin, the first gate structure including a first gate in contact with a side surface and a top surface of the fin and a first spacer surrounding the first gate; forming a second gate structure on the fin, the second gate structure including a second gate in contact with the side surface and the top surface of the fin and a second spacer surrounding the gate; removing part of the fin between the first gate and the structure to form a fin recess, the fin recess having a first sidewall that is substantially flush with a sidewall of the first spacer and second sidewall that is substantially flush with a sidewall of the second spacer, wherein the fin recess has a rounded bottom and a portion of the fin remains below the fin recess; forming a doped epitaxial S-D region in the fin recess; and annealing the doped epitaxial S-D region to diffuse dopant atoms into a region of the fin below the first gate and the second gate to form an abrupt uniform junction.

According to another embodiment, a structure is disclosed. The structure may include: a fin on a semiconductor substrate; a first gate structure on the fin, the first gate structure including a first gate in contact with a side surface and a top surface of the fin and a first spacer surrounding the first gate; a second gate structure on the fin, the second gate structure including a second gate in contact with the side surface and the top surface of the fin and a second spacer surrounding the gate; a doped epitaxial S-D region between the first gate structure and the second gate structure, the doped epitaxial S-D region formed within the fin; a portion of the fin between a bottom of the S-D region and an isolation layer; and an abrupt junction of dopant atoms diffused into a portion of the fin below the first gate and the second gate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIGS. 1A-1B are a top view and a cross section view illustrating a structure, according an embodiment of the present invention.

FIGS. 2A-2B are a top view and a cross section view illustrating removing a portion of a fin to form a fin recess, according an embodiment of the present invention.

FIGS. 3A-3B are a top view and a cross section view illustrating forming a buffer layer in the fin recess, according an embodiment of the present invention.

FIGS. 6A-6B are a top view and a cross section view illustrating a structure, according an embodiment of the present invention.

FIGS. 7A-7B are a top view and a cross section view illustrating removing a portion of a fin to form a fin recess, according an embodiment of the present invention.

FIGS. 8A-8B are a top view and a cross section view illustrating forming a S-D region in the fin recess, according an embodiment of the present invention.

FIG. 9A is a cross section view illustrating a uniform and abrupt junction profile along section line C-C', according to an embodiment of the present invention.

Figure 4A:
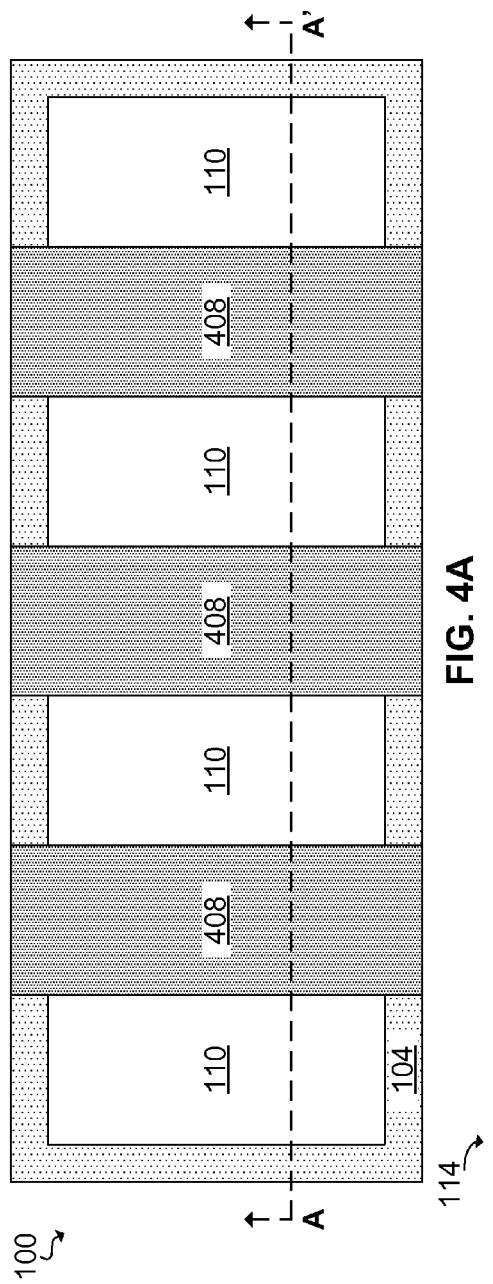
FIGS. 4A-4B are a top view and a cross section view illustrating forming a S-D region on the buffer layer in the fin recess, according an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor devices and more particularly, to a structure and method of forming a uniform channel and junction high density technologies, such as tight pitch FinFET devices, using recessed source-drain (S-D) regions and annealing techniques.

The continuous scaling of transistor devices has produced a series of difficult challenges to the processes used to form the active layers in deep sub-micron transistors. Two major requirements in the downsizing of FETs are the suppression of "off" state leakage currents, and low resistance for a high current drive in the "on" state. In small gate lengths, even when the device is in the "off" state, a leakage current from the drain to the source may be observed due to the decreased threshold voltage ($V_T$) of the small gate. The space charge region near the drain may also touch the source somewhere deeper in the substrate where the gate bias cannot control the potential and punch through may occur at smaller drain biases. The off current is a key design parameter and can be minimized by keeping the S-D junctions shallow.

Typically, ion implantation that is self-aligned to the gate electrode, or alternatively, aligned to sidewall spacers that are adjacent to the gate electrode may be used to form ultra-shallow junctions (e.g., less than about 300 Angstroms), but the amount of implantation may be increasingly difficult to control. For example, higher dopant implant concentrations are required to avoid an increase in parasitic resistances at shallower junction depths. While reducing the ion implantation energy may result in shallower junctions, the higher required dopant concentration required may result in significant damage to the semiconductor substrate and adjacent structures, including forming amorphous or disordered lattice regions.

Alternatively, solid source diffusion may be an approach to forming S-D junction regions. Here, a solid phase diffusion source layer may be formed on a substrate, followed by an annealing step (e.g., rapid thermal anneal, laser anneal, spike anneal) to diffuse the dopant impurities into the channel region. The solid phase diffusion source layer may be embedded S-D region epitaxially grown adjacent to a FET channel. However, conventional techniques of solid source doping may lead to poor diffusion of dopants into the channel region, resulting in a nonuniform channel and/or a graded junction.

A way to form an S-D junction in a FinFET device having an abrupt and uniform profile, without causing damage to the fins, may be to recess the fin laterally during the formation of the source drain region, fill the recess with an epitaxial material, and then perform an annealing process to cause the dopants to diffuse into the channel region. Embodiments by which to form the uniform and abrupt junction are described below in detail with reference to FIGS. 1-9.

Referring now to FIGS. 1A-1B, multiple views of a structure 100 are shown. FIG. 1A is a top view of the structure 100. FIG. 1B is a cross section view of the structure 100 along section line A-A'. The structure 100 may be a FinFET device formed using any conventional technique known in the art.

In an embodiment, the structure 100 may be formed on a semiconductor-on-insulator (SOI) substrate 112. The SOI substrate 112 may include a fin 106, formed out of an SOI layer, separated from a base substrate 102 by an isolation layer 104. The base substrate 102 may be composed of an undoped or doped crystalline semiconductor material, an undoped or doped polycrystalline semiconductor material, an undoped amorphous semiconductor material, or an undoped amorphous semiconductor material that is subsequently doped and annealed to convert it to a doped polycrystalline semiconductor material.

The doped semiconductor material may be formed with in-situ doping or implantation. The doped semiconductor material may be selected from doped crystalline silicon, polysilicon, doped polycrystalline germanium, a doped silicon-germanium polycrystalline alloy, a doped silicon carbon polycrystalline alloy, a doped silicon-germanium-carbon polycrystalline alloy, doped polycrystalline gallium arsenide, doped polycrystalline indium arsenide, doped polycrystalline indium phosphide, doped polycrystalline III-V compound semiconductor materials, doped polycrystalline II-VI compound semiconductor materials, doped polycrystalline organic semiconductor materials, and other doped polycrystalline compound semiconductor materials. The thickness of the base substrate 102 may range from approximately 50 microns to approximately 1000 microns, although lesser and greater thicknesses can also be employed. In an embodiment, the base substrate 102 may be doped with n-type dopants or p-type dopants. The dopant concentration of the base substrate 102 may range from approximately 1.0E15 atm/cm$^3$ to approximately 1.0E17 atm/cm$^3$, although lesser and greater dopant concentrations can also be employed.

The isolation layer 104 may composed of dielectric material, such as, for example, silicon dioxide. In an embodiment, the fin 106 may be composed of single-crystal silicon. If the structure 100 is a PFET, the fin 106 may be undoped or lightly doped with n-type dopants, such as for example, phosphorus and arsenic, at a concentration ranging from approximately 1E16 atm/cm$^3$ to approximately 1E19 atm/cm$^3$. If the structure 100 is a NFET, the fin 106 may be an undoped or lightly doped with p-type dopants, such as for example, boron, at a concentration ranging from approximately 1E16 atm/cm$^3$ to approximately 1E19 atm/cm$^3$. In an embodiment, the fin 106 may be intrinsic (i.e., completely undoped).

The structure 100 may also include a gate structure 114 formed on the fin 106. The gate structure 114 may include a gate 108 and a spacer 110. The gate 108 may include a gate dielectric and a gate conductor that can be formed via any known process in the art, including a gate-first process and a gate-last process. The gate structure 114 may have a height of approximately 40 nm to approximately 200 nm, preferably approximately 50 nm to approximately 150 nm.

In a gate-first process, the gate 108 may include a gate dielectric, a gate electrode and a hard cap to protect the gate electrode and the gate dielectric (not shown). The gate dielectric may include an insulating material including, but not limited to: oxide, nitride, oxynitride or silicate including metal silicates and nitrided metal silicates. In one embodiment, the gate dielectric may include an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof. The physical thickness of the gate dielectric may vary, but typically may have a thickness ranging from approximately 0.5 nm to approximately 10 nm.

The gate electrode may be formed on top of the gate dielectric. The gate electrode may be deposited by any suitable technique known in the art, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode may include, for example, Zr, W, Ta, Hf, Ti, Al, Ru, Pa, metal oxides, metal carbides, metal nitrides, transition metal aluminides (e.g. $Ti_3Al$, ZrAl), TaC, TiC, TaMgC, or any combination of those materials. The gate electrode may also include a silicon layer located on top of a metal material, whereby the top of the silicon layer may be silicided. The gate electrode may have a thickness approximately of approximately 20 nm to approximately 100 nm and a width of approximately 10 nm to approximately 250 nm, although lesser and greater thicknesses and lengths may also be contemplated. The hard cap may be made of an insulating material, such as, for example, silicon nitride, capable of protecting the gate electrode and gate dielectric during subsequent processing steps.

In a gate-last process, the gate 108 may include a sacrificial gate (not shown) that may be later removed and replaced by a gate dielectric and a gate electrode such as those of the gate-first process described above. The sacrificial gate may be made of a polysilicon material with a sacrificial dielectric material (e.g., silicon oxide) formed using known deposition techniques known in the art. The gate structure 114 may also include a hard cap (not shown) made of an insulating material, such as, for example, silicon nitride, capable of protecting the gate electrode and gate dielectric during subsequent processing steps.

Following formation of the gate 108, a spacer 110 may be formed on an upper surface and sidewalls of the gate 108. The spacer 110 may be made of, for example, silicon nitride, silicon oxide, silicon oxynitrides, or a combination thereof. The spacer 110 may be formed by any method known in the art, including depositing a conformal silicon nitride layer over the gate 108 and etching to remove unwanted material from the conformal silicon nitride layer. The spacer 110 may have a thickness of approximately 1 nm to approximately 10 nm.

Referring now to FIGS. 2A-2B, multiple views of the structure 100 are shown. FIG. 2A is a top view of the structure 100. FIG. 2B is a cross section view of the structure 100 along section line A-A'. FIGS. 2A-2B illustrate removing a portion of the fin 106 to form a fin recess 202. The fin recess 202 may be formed between two adjacent spacers 110 so that a portion of the fin 106 remains below the gate 108 to form a channel 204. In an embodiment, the fin recess 202 may be formed so that is undercut (i.e., the channel 204 has a sidewall that is substantially flush with a sidewall of the gate). In an embodiment, a remaining portion 206 of the fin 106 may be present below a flat bottom of the fin recess 202. The fin recess 202 may be formed by etching the fin 106 using conventional etching techniques that may be selective to the spacer 110. In an embodiment, a combination of reactive ion etching (RIE) followed time controlled wet etch may be used to form the undercut.

Referring now to FIGS. 3A-3B, multiple views of the structure 100 are shown. FIG. 3A is a top view of the structure 100. FIG. 3B is a cross section view of the structure 100 along section line A-A'. FIGS. 3A-3B illustrate forming a buffer layer 302 in the fin recess 202. The buffer layer 302 may be formed on a bottom and sidewalls of the fin recess 202. The buffer layer 302 may be deposited by a conventional deposition process, such as, for example, chemical vapor deposition (CVD), plasma enhanced CVD (PECVD), metal organic CVD (MOCVD), atomic layer deposition (ALD), evaporation, reactive sputtering, chemical solution deposition, and other like processes. In an embodiment, the buffer layer 302 may be formed using epitaxial growth. In an embodiment, the buffer layer 302 may be conformal to the bottom and the sidewalls of the fin recess 202. The buffer layer 302 may have a facet 304 directly below the spacer 110 as a result of the deposition process. The facet 304 may result in the buffer layer 302 having a thickness that decreases as it approaches a bottom surface of the spacer 110. Although the buffer layer is shown having a facet 304 below the spacer 110 in FIG. 3B, embodiments are contemplated in which the buffer layer 302 has a uniform thickness on each of the bottom and the sidewalls.

The buffer layer 302 may be composed of an undoped or lightly doped semiconductor material, such as, for example, Si, carbon doped silicon having a concentration of carbon up to 4%, SiGe, or Ge. In an embodiment in which the structure 100 is a NFET, the buffer layer 302 may be doped with n-type dopants, such as, for example phosphorus or arsenic doping. In an embodiment in which the structure 100 is a PFET, the buffer layer 302 may be doped with p-type dopants, such as, for example, boron. It should be noted that the dopant concentration in the buffer layer 302 may be less than a dopant concentration in a subsequent S-D region formed on the buffer layer 302 as described below in detail with reference to FIGS. 4A-4B. In an embodiment, the concentration of dopants in the buffer layer 302 may range from approximately 1E18 atm/cm$^3$ to approximately 8E19 atm/cm$^3$.

Figure 4B:
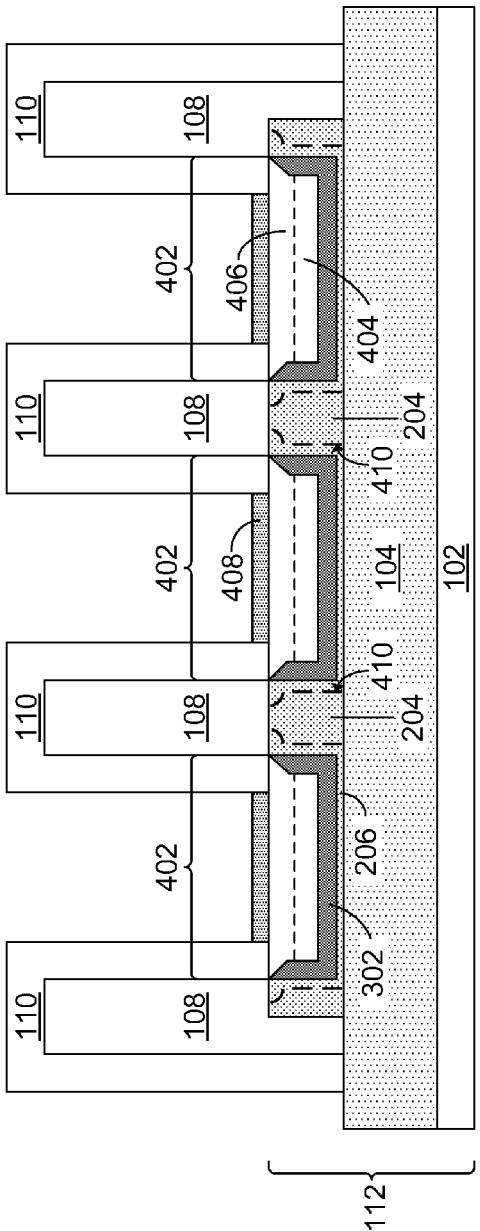

Referring now to FIGS. 4A-4B, multiple views of the structure 100 are shown. FIG. 4A is a top view of the structure 100. FIG. 4B is a cross section view of the structure 100 along section line A-A'. FIGS. 4A-4B illustrate forming a S-D region 402 on the buffer layer 302 in the fin recess 202 (FIG. 3B). The S-D region 402 may be formed by growing a doped semiconductor material in the fin recess 202 (FIG. 3B) using any conventional epitaxial growth and doping process. In an embodiment, the doped epitaxial material may be formed using in-situ doping. In an embodiment, the doped epitaxial material may be formed such that an upper surface of the S-D region 402 is substantially flush with a bottom surface of the spacer 110. In another embodiment, the upper surface of the S-D region 402 may be above the bottom surface of the spacer 110.

The doped epitaxial material may be formed in layers, such that different layers may have different dopant concentrations. Although a first layer 404 and a second layer 406 are shown in FIG. 4B, embodiments are contemplated in which the S-D region 402 is composed of more than two layers. In an embodiment, the dopant concentration between the first layer 404 and the second layer 406 may be graded such that, for example, the second layer 406 is lightly doped while the first layer 404 is more highly doped, or vice versa. In an embodiment, the first layer 404 may have an average dopant concentration ranging from approximately 1E20 atm/cm$^3$ to approximately 4E20 atm/cm$^3$ and the second layer 406 may have an average dopant concentration ranging from approximately 3E20 atm/cm$^3$ to approximately 8E20 atm/cm$^3$, although greater compositions are contemplated.

This concentration gradient, along with the buffer layer 302 adjacent to the channel 204 may provide a uniform and abrupt junction of dopant concentration along a vertical length of the channel 204 during a subsequent annealing process. In an embodiment in which the structure 100 is an NFET, the doped epitaxial material may be composed of, for example, carbon doped silicon having a concentration of carbon up to 4%, and may be doped with n-type dopants, such as, for example phosphorus or arsenic doping. In an embodiment in which the structure 100 is a PFET, the epitaxial material could be silicon germanium (SiGe) doped with p-type dopants, such as, for example, boron.

In an embodiment, a cap layer 408 may be formed on the S-D region 402. The cap layer may be formed using conventional deposition techniques, such as, for example, CVD, PECVD, MOCVD, ALD, evaporation, reactive sputtering, chemical solution deposition, and other like processes. In an embodiment, the cap layer 408 may be formed using epitaxial growth. In an embodiment in which the structure 100 is a pFET, the cap layer 408 may be composed of SiGe. In an embodiment in which the structure 100 is a nFET, the cap layer 408 may be composed of carbon doped silicon having a concentration of carbon up to 4%. The cap layer 408 may be undoped, or may be doped with p-type or n-type dopants. In an embodiment in which the cap layer 408 is doped with p-type or n-type dopants, the concentration of dopants may range from approximately 1E18 atm/cm$^3$ to approximately 8E20 atm/cm$^3$.

After the doped epitaxial is deposited, the structure 100 may be annealed to diffuse the dopants into the channel 204. In an embodiment, the annealing process may be a millisecond anneal such as a laser spike anneal or a flash lamp anneal. The millisecond annealing process may include subjecting the structure 100 to an elevated temperature, ranging from approximately 800° C. to approximately 1250° C., for approximately 1 ms to approximately 500 ms. In another embodiment, the annealing process may be a rapid thermal anneal (RTA). The RTA process may include may include subjecting the structure 100 to an elevated temperature, ranging from approximately 800° C. to approximately 1080° C., for approximately 1 sec to approximately 10 sec. During annealing, the individual layers of the doped epitaxial material may become comingled as one layer with a graded dopant concentration (i.e., dose activation) as discussed above.

In addition, the annealing process may force dopant atoms to migrate into the channel 204 to form an abrupt S-D junction 410. Because of the undercut profile of the fin recess 202 (FIG. 3), the presence of the buffer layer 302, and the graded dopant composition in the S-D region 402, the dopants from the S-D region 402 may migrate into the channel 204 at a uniform depth and may form an abrupt concentration line having a facet directly below the gate 108.

Figure 5A:
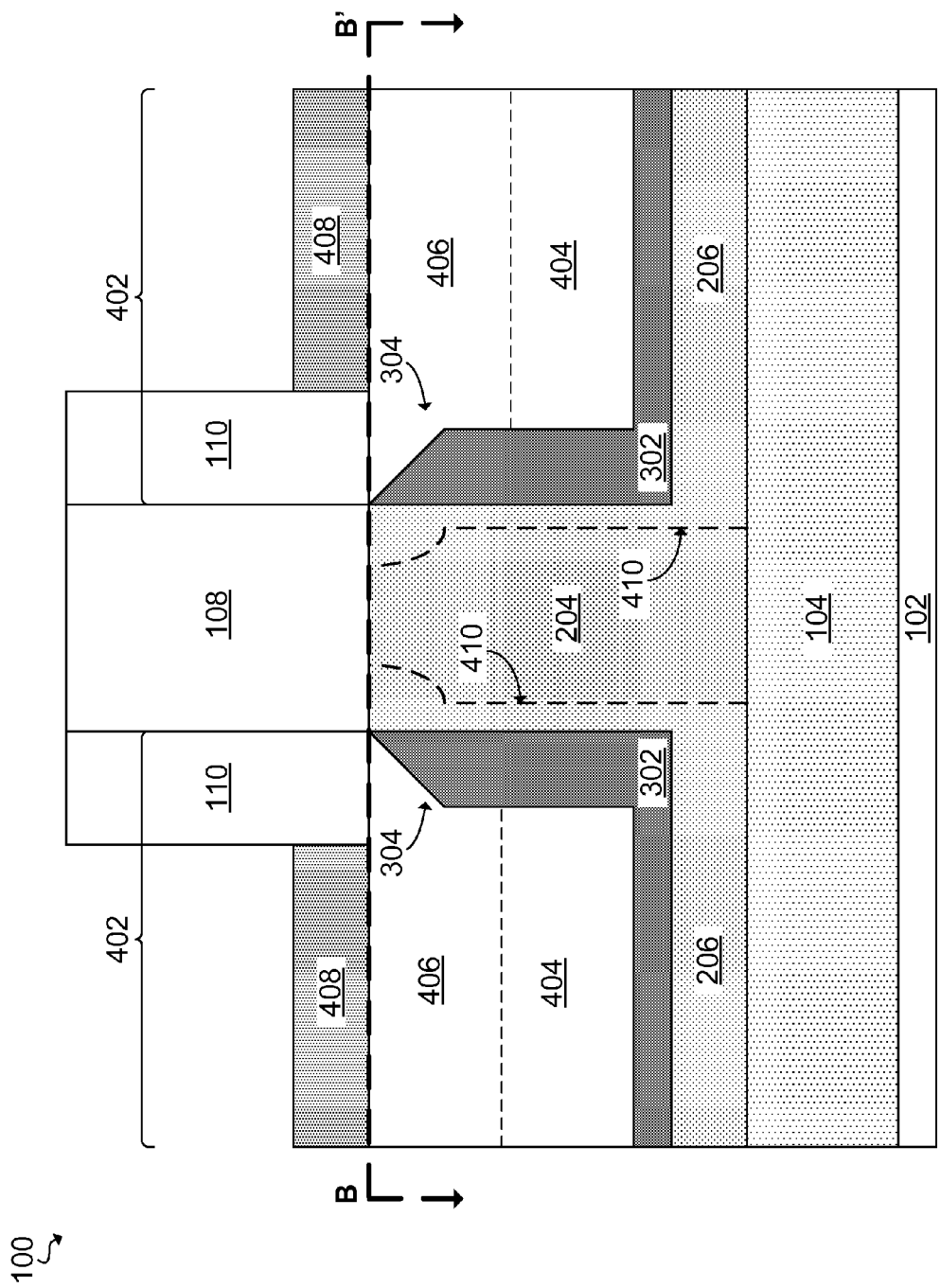
FIG. 5A is a cross section view illustrating a uniform and abrupt junction profile along section line A-A', according to an embodiment of the present invention.
Figure 5B:
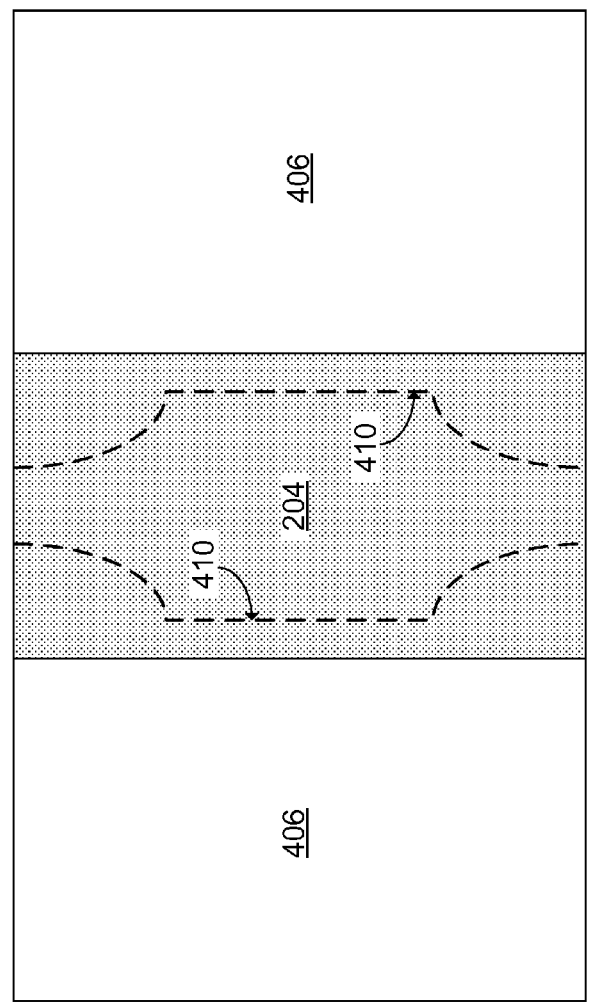
FIG. 5B is a cross section view illustrating a uniform and abrupt junction profile along section line B-B', according to an embodiment of the present invention.

Referring now to FIG. 5A, a cross section view of the structure 100 along section line A-A' (FIG. 4A) is shown. FIG. 5A is an enlarged view of the channel 204 and illustrates the uniform and abrupt junction 410 profile. To better illustrate the uniform and abrupt junction 410, FIG. 5B is shown. FIG. 5B is a cross section view of the structure 100 along section line B-B'. The facet 304 in the buffer layer 302 may control the formation of the uniform and abrupt S-D junction 410 formation during the annealing process. In an embodiment, the facet 304 may allow for the doped material of the S-D region 402 to be closer to the channel 204 directly below the gate 108 as compared to lower portions of the channel. Therefore, the dopant atoms present in the S-D region 402 may have a preferred path to diffuse into to the upper portion of the channel 204 during the annealing process. The dopant atoms may act as a S-D extension and junction to the channel.

Another embodiment by which to form a uniform and abrupt S-D junction is described in detail below by referring to the accompanying drawings FIGS. 6-9. In the present embodiment, a fin recess having a rounded bottom may be formed between adjacent gates that is not undercut below the spacer.

Referring now to FIGS. 6A-6B, multiple views of a structure 200 are shown. FIG. 6A is a top view of the structure 200. FIG. 2B is a cross section view of the structure 200 along section line C-C'. The structure 200 may be a FinFET device formed using any conventional technique known in the art. The structure 200 may be substantially similar to the structure 100 and may formed using substantially similar techniques as those described above with reference to FIGS. 1A-1B.

Referring now to FIGS. 7A-7B, multiple views of the structure 200 are shown. FIG. 7A is a top view of the structure 100. FIG. 7B is a cross section view of the structure 200 along section line C-C'. FIGS. 7A-7B illustrate removing a portion of the fin 106 to form a fin recess 702. The fin recess 702 may be formed between two adjacent spacers 110 so that a portion of the fin 106 remains below the gate 108 to form a channel 704. In an embodiment, the fin recess 702 may be formed so that a sidewall of the fin recess 702 is substantially flush with a sidewall of the spacer 110 (i.e., the channel 704 may extend between the exterior sidewalls of the spacer 110). In an embodiment, a remaining portion 706 of the fin 106 may be present below a rounded bottom of the fin recess 702. The fin recess 702 may be formed by etching the fin 106 using a conventional etching technique that is selective to the spacer 110, such as, for example, RIE.

Referring now to FIGS. 8A-8B, multiple views of the structure 200 are shown. FIG. 8A is a top view of the structure 200. FIG. 8B is a cross section view of the structure 200 along section line C-C'. FIGS. 8A-8B illustrate forming a S-D region 802 in the fin recess 702 (FIG. 7B). The S-D region 802 may be formed by growing a doped semiconductor material in the fin recess 702 (FIG. 7B) using any conventional epitaxial growth and doping process. In an embodiment, the doped epitaxial material may be formed using in-situ doping. In an embodiment, the doped epitaxial material may be formed such that an upper surface of the S-D region 802 is substantially flush with a bottom surface of the spacer 110. In another embodiment, the upper surface of the S-D region 802 may be above the bottom surface of the spacer 110.

The doped epitaxial material may be formed in layers, such that different layers may have different dopant concentrations. Although a first layer 804 and a second layer 806 are shown in FIG. 8B, embodiments are contemplated in which the S-D region 802 is composed of more than two layers. In an embodiment, the dopant concentration between the first layer 804 and the second layer 806 may be graded such that, for example, the second layer 806 is lightly doped while the first layer 804 is more highly doped, or vice versa. In an embodiment, the first layer 804 may have an average dopant concentration ranging from approximately 6E20 atm/cm$^3$ to approximately 2E21 atm/cm$^3$ and the second layer 806 may have an average dopant concentration ranging from approximately 1E20 atm/cm$^3$ to approximately 8E20 atm/cm$^3$, although greater compositions are contemplated.

This concentration gradient, adjacent to the channel 704, may provide a uniform and abrupt junction of dopant concentration along a vertical length of the channel 704 during a subsequent annealing process. In an embodiment in which the structure 200 is an NFET, the doped epitaxial material may be composed of, for example, carbon doped silicon having a concentration of carbon up to 4%, and may be doped with n-type dopants, such as, for example phosphorus or arsenic doping. In an embodiment in which the structure 200 is a PFET, the epitaxial material could be silicon germanium (SiGe) doped with p-type dopants, such as, for example, boron.

In an embodiment, a cap layer 808 may be formed on the S-D region 802. The cap layer may be formed using conventional deposition techniques, such as, for example, CVD, PECVD, MOCVD, ALD, evaporation, reactive sputtering, chemical solution deposition, and other like processes. In an embodiment, the cap layer 808 may be formed using epitaxial growth. The composed of silicon. In an embodiment in which the structure 200 is a pFET, the cap layer 808 may be composed of SiGe. In an embodiment in which the structure 200 is a nFET, the cap layer 808 may be composed of carbon doped silicon having a concentration of carbon up to 4%. The cap layer 808 may be undoped, or may be doped with p-type or n-type dopants. In an embodiment in which the cap layer 808 is doped with p-type or n-type dopants, the concentration of dopants may range from approximately 1E18 atm/cm$^3$ to approximately 8E20 atm/cm$^3$.

After the doped epitaxial is deposited, the structure 200 may be annealed to activate the dopant atoms in the doped epitaxial material and to complete the formation of the S-D region 802. In an embodiment, the annealing process may be a millisecond anneal such as a laser spike anneal or a flash lamp anneal. The millisecond annealing process may include subjecting the structure 200 to an elevated temperature, ranging from approximately 800° C. to approximately 1250° C., for approximately 1 ms to approximately 500 ms. In another embodiment, the annealing process may be a rapid thermal anneal (RTA). The RTA process may include may include subjecting the structure 200 to an elevated temperature, ranging from approximately 800° C. to approximately 1080° C., for approximately 1 sec to approximately 10 sec. During annealing, the individual layers of the doped epitaxial material may become comingled as one layer with a graded dopant concentration (i.e., dose activation) as discussed above. In addition, the annealing process may force dopant atoms to migrate into the channel 704 to form a uniform and abrupt S-D junction 810.

Figure 9B:
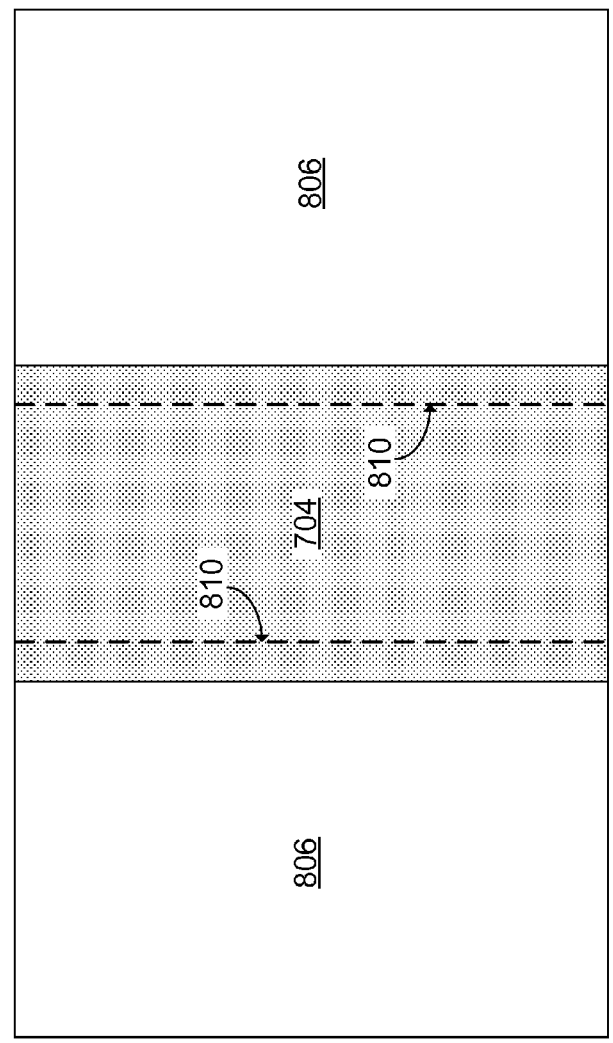
FIG. 9B is a cross section view illustrating a uniform and abrupt junction profile along section line D-D', according to an embodiment of the present invention.

Referring now to FIGS. 9A-9B, a cross section view of the structure 100 along section line C-C' (FIG. 8A) is shown. FIG. 9A is an enlarged view of the channel 704 and illustrates the uniform and abrupt junction 410 profile. To better illustrate the uniform and abrupt junction 810, FIG. 9B is shown. FIG. 5B is a cross section view of the structure 100 along section line D-D'. Because of the graded dopant concentration in the S-D region 802, as well as the rounded bottom of the S-D region 802, the dopant atoms from the S-D region 802 may migrate into the channel 704 at a uniform depth and may form an abrupt straight concentration line rather than a rounded profile resembling the shape of the S-D region 802. The uniform and abrupt junction 810 may extend perpendicular to the top surface of the fin for substantially the height of the doped epitaxial S-D region.

Embodiments of the present invention may allow for the fabrication of a uniform and abrupt S-D junction butting region in a FinFET device by epitaxially growing a S-D region in a fin recess, and then performing an annealing process to force the S-D dopant atoms into a channel region below a gate. The uniform and abrupt S-D junction may allow for a FinFET structure having very short channel length and low source/drain extension resistivity, yet operable to produce high drive currents without suffering from the short channel effects that produce significant levels of off-state current. In an embodiment, the undercut profile of the S-D region having a graded dopant concentration, along with the buffer layer adjacent to the channel may allow for the dopant atoms to diffuse into the channel in a uniform and abrupt fashion, producing a uniform channel length with higher strain stress than conventional techniques. In another embodiment, the rounded bottom and graded dopant concentration of the S-D region may allow for the dopant atoms to diffuse into the channel in a uniform and abrupt fashion, producing a uniform channel length with higher strain stress than conventional techniques.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:
1. A structure comprising:
  a semiconductor substrate;
  an isolation layer on the semiconductor substrate;
  a fin on the isolation layer, the fin comprising a first channel region and a second channel region;
  a first gate structure on the fin adjacent to the first channel region, the first gate structure comprising a first gate in contact with a side surface and a top surface of the fin and a first spacer surrounding the first gate;

a second gate structure on the fin adjacent to the second channel region, the second gate structure comprising a second gate in contact with the side surface and the top surface of the fin and a second spacer surrounding the second gate;

a recess in the fin, the recess being positioned laterally between the first channel region and the second channel region and having a bottom that is above and separated from the isolation layer; and, a doped epitaxial source-drain region within the recess, the doped epitaxial source-drain region having a dopant concentration that decreases from a bottom surface of the doped epitaxial source-drain region at the bottom of the recess toward an upper surface of the doped epitaxial source-drain region, the fin further having a first abrupt source-drain junction below the first gate and positioned laterally immediately adjacent to the first channel region and a second abrupt source-drain junction below the second gate and positioned laterally immediately adjacent to the second channel region, wherein portions of the fin between the doped epitaxial source-drain region and the first abrupt source-drain junction and between the doped epitaxial source-drain region and the second abrupt source-drain junction contain dopant atoms diffused from the doped epitaxial source-drain region; and further comprising a buffer layer in the recess located between the doped epitaxial source-drain region and a sidewall of the first gate, between the doped epitaxial source-drain region and a sidewall of the second gate, and between the doped epitaxial source-drain region and the bottom of the recess, the buffer layer having a first facet directly below the first spacer and a second facet directly below the second spacer.

2. The structure of claim 1, further comprising a cap layer on the dope epitaxial source-drain region.

3. The structure of claim 1, the dope epitaxial source-drain having a first sidewall that is substantially flush with the first spacer and a second sidewall that is substantially flush with the second spacer.

4. The structure of claim 1, the bottom of the recess being essentially planar.

5. The structure of claim 1, the bottom of the recess being rounded.

* * * * *